May 26, 1959 D. K. ROSS 2,888,523

CARRIER FREQUENCY D.C. AMPLIFIER

Filed Dec. 8, 1954

INVENTOR:
DONALD K. ROSS,
BY Kingsland, Rogers & Ezell
ATTORNEYS

United States Patent Office 2,888,523

Patented May 26, 1959

2,888,523

CARRIER FREQUENCY D.C. AMPLIFIER

Donald Kenneth Ross, Clayton, Mo., assignor, by mesne assignments, to White-Rodgers Company, a corporation of Delaware Application December 8, 1954, Serial No. 473,794

1 Claim. (Cl. 179—171)

This invention relates to D.C. and low frequency signal amplifiers, and in particular is concerned with improvements for amplifiers for D.C. and low frequency signals by the use of an A.C. amplifier through the employment of a modulated carrier frequency.

The amplifier circuit provided by this invention makes use of a single mechanical chopper, which inverts the D.C. signal to A.C., and, after amplification, then demodulates by the same mechanical chopper. This provides an amplifier having low frequency characteristics of a D.C. amplifier with the inherent stability of the A.C. amplifier. As a result, a low level D.C. signal can be amplified to a high order with negligible drift.

In this invention, the term "D.C. signal" is a relative term and, for the purpose of description, includes direct current up to a small A.C. frequency range which can be as high as approximately one-tenth of the chopper excitation frequency. Through the application of this invention, the load resistance to the amplifier circuit can be substantially reduced, and can be of a relatively small value, which is of advantage. The drift in the circuit is negligible and is limited to thermal noise and pickup in the chopper, which can be disregarded for practical applications.

The D.C. amplifier of this invention with its low drift is of value in a multitude of fields and, as an example, can be used in electronic computers as a precise operational amplifier. Also, it can be utilized as a very sensitive, drift-free, phase sensitive detector as an entirely different application where an input signal of the same frequency (or an integral multiple thereof) as the chopper excitation frequency is utilized.

Accordingly, it is a principal object of this invention to provide an improved A.C. amplifier for amplifying D.C. signals by inversion of the D.C. signal to A.C.

Still another object of this invention is to provide an amplifier for amplifying D.C. signals through a single mechanical chopper to invert the D.C. signal and then demodulate by said chopper, in which the amplification is with negligible drift.

Yet a further object of this invention is to provide an improved A.C. amplifying circuit for a D.C. signal which has high stability.

Still a further object of this invention is to provide a modulating and demodulating circuit comprising a mechanical chopper and A.C. amplifier which can be used as a highly sensitive, drift-free, phase-sensitive detector.

Still another object of this invention is to provide a D.C. amplifying circuit and phase-sensitive detector in which standard electrical components can be utilized in a rugged and stable circuit.

Further objects of this invention will appear in the detailed description which follows and will be further apparent to those skilled in the art.

There is shown in the accompanying drawings a preferred embodiment of this invention. But it is to be realized that these drawings are for the purpose of illustration only and that the invention is not limited thereto.

Figure 1:
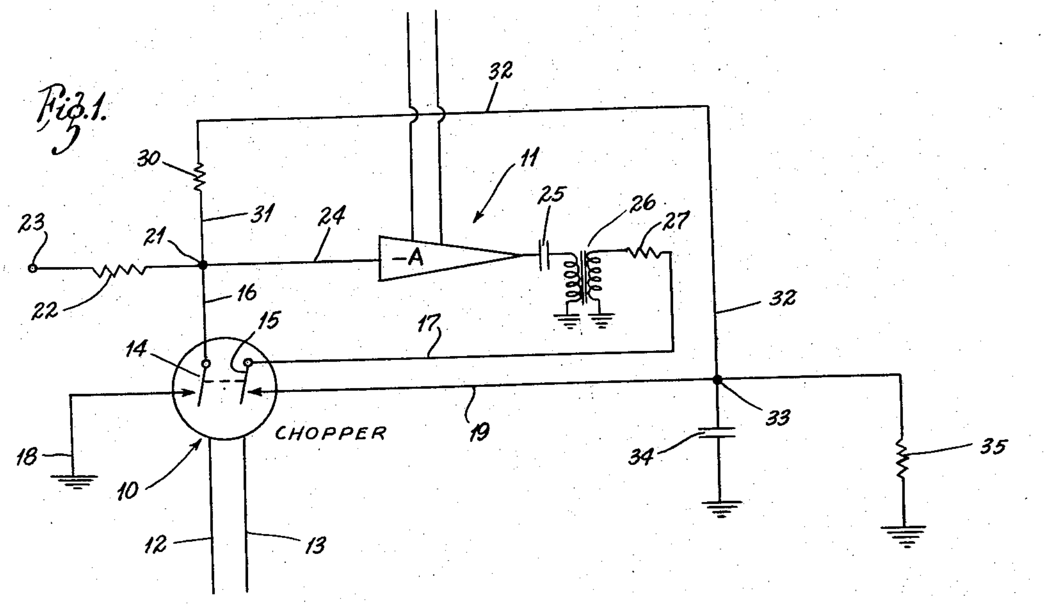
Figure 1 is a schematic view of the circuit diagram of this invention.

In Figure 1, the main components of the circuit of this invention are the chopper generally indicated at 10 and the A.C. amplifier generally indicated at 11. Both of these components are energized by external sources, but are connected into the D.C. signal circuit in a manner which will be described.

The chopper 10 is a 400 c.p.s., double-pole, single-throw apparatus, such as that conventionally sold by Minneapolis-Honeywell under the designation WG 178 or SG 6 B. In this chopper, one pole makes when the other breaks, and this operation should be either simultaneous, or the break should be before the make. Although the excitation frequency in this case is 400 c.p.s., other frequencies may be employed by using different choppers.

As shown in Figure 1, the chopper 10 is energized by two leads 12 and 13 which connect to a source of 6.3 volt, 400 c.p.s. electrical supply. There are two poles 14 and 15 which are connected to leads 16 and 17, respectively. The pole 14 is shown in the make position against a ground 18, while the pole 15 is in the break position from a lead 19 leading to further elements in the output circuit, which will be described below.

The lead 16 is connected to a four-way junction post 21. Connected to this junction post 21 is a resistance 22 which leads at its other end to a D.C. signal source 23.

A third lead 24 connects the junction post 21 with the input side of the A.C. amplifier 11. This amplifier is of the signal inverting type.

The output end of the amplifier 11 is connected to a capacitor 25 and a transformer 26. On the output side of the transformer there is a resistance 27 connected to wire 17 leading to the chopper. Feedback resistor 30 is connected at one end to a lead 31, which is the fourth lead in the terminal junction 21. The other end of the resistance 30 is connected through leads 32, 19, and intermediate post 33, back to the chopper. A filter capacitor 34 is connected into this circuit at post 33 between the leads 19 and 32, as indicated, and is grounded at its other terminal. A load resistance 35 is connected in parallel with the capacitor 34 to post 33.

The A.C. amplifier 11 utilized in this embodiment of the invention is of signal inverting characteristic to prevent positive feedback. Further, it is a high pass or band pass type which passes the carrier frequency with its side bands but attenuates the lower modulating frequency.

Figure 2:
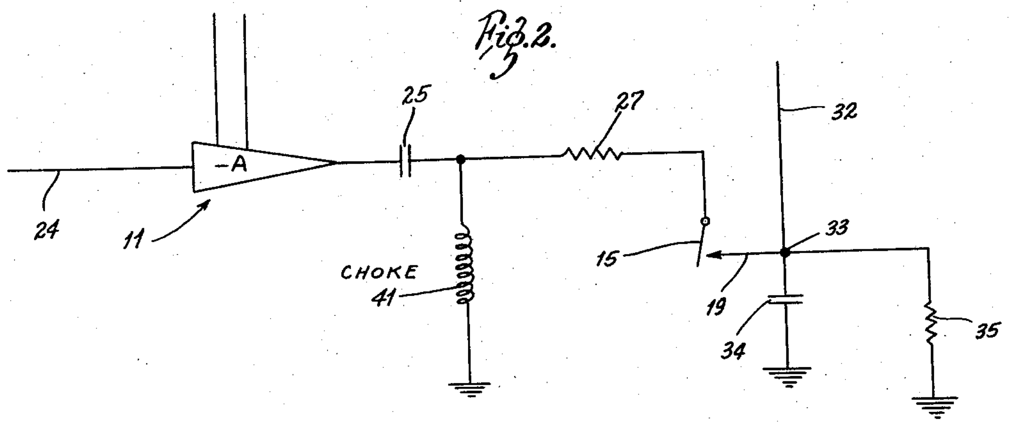
Figure 2 is a schematic view of a modified portion of the circuit diagram.

The amplifier in Figure 1 is transformer-output coupled. If a resistance-capacitor output coupling is desired, a choke must be used as is shown in the modification of Figure 2 to prevent the output coupling capacitor 25 from building up a D.C. charge in series with capacitor 34. Otherwise the capacitor 25 must be made excessively large.

In the modification of Figure 2 for resistance-capacitance coupling, components which are the same as that of Figure 1 are given like numerals. It will be seen that between the resistance 27 and the amplifier 11 a choke 41 connected to ground has been provided for this type of coupling. In view of the fact that a choke is required, an output transformer might desirably be used, which would eliminate the need for the capacitor 25 and also minimize the number of amplifier stages to that required for gain considerations, since the transformer may be used to get the required phase inversion.

*Operation*

In the operation of this circuit, the D.C. signal through the resistance 22 is periodically shorted to ground through pole 14 of the chopper. This produces a pulsating D.C.

signal through the lead 24 to the amplifier. This D.C. signal, pulsating at 400 c.p.s., is then amplified by the A.C. amplifier 11 becoming a 400 c.p.s. A.C. signal, modulated in amplitude by the D.C. level of the input signal.

The demodulator circuit portion of this invention functions as a synchronous rectifier. Once every 400 c.p.s. it samples the output of the amplifier 11 and charges the capacitor 34. The time constant for the resistance 35 and the capacitor 34 is long enough to prevent decay of the charge on the capacitor during the period when the output chopper pole 15 is opened. Since the chopper can pass current in either direction, input signal polarity is maintained.

The gain of the D.C. amplifier is found to vary with the phase shift of the amplifier at the carrier frequency of 400 c.p.s. The amount of phase shift required for maximum gain is a function of the chopper dwell time.

When used as an operational amplifier the ratio of resistance 30 to resistance 22 determines the gain of the amplifier. In choosing the values of resistance 30 and resistance 22 for proper closed loop gain of the amplifier, the resistance 30 should be much larger than the load resistance 35 to prevent discharge of the capacitor 34 during the time the input circuit is shorted. Expressed another way, the parallel combination of resistance 30 and resistance 35 must be used to compute the decay time constant of the voltage on capacitor 34. The resistor 27 may be required to limit the charging current of the capacitor 34 to a value recommended by the chopper manufacturers. Under these conditions, the chopper pole life is quite good as the input pole 14 is always near a ground potential and the output pole 15 need only supply the current lost by the capacitor because of discharge. Furthermore, when the contacts break, both contacts of the output pole 15 have come to the same potential.

As an actual example, the circuit of Figure 1 can be employed with the following values:

| | |
|---|---|
| Resistor 22 | 100,000 ohms. |
| Resistor 30 | 1,500,000 ohms. |
| Resistor 27 | 15,000 ohms. |
| Resistor 35 | 8,000 ohms. |
| Capacitor 34 | 0.5 microfarads. |

With these circuit values, the D.C. gain of the amplifier on an open loop basis is about 35% of the A.C. gain. The closed loop gain is, of course, determined by the ratio of resistors 30 and 22 in the manner known to those acquainted with the art. In this example the closed loop gain is 15.

The circuit of this invention has the highly desirable feature of good closed loop stability. As seen by a reference to Figure 1, during part of the cycle the output of the amplifier is fed back to the input through resistance 30 to the junction terminal 21. If the circuit were unstable, it would normally oscillate when the output pole of the chopper was closed. However, in this circuit, before the oscillation has time to build up, the output is disconnected from the input, which is a chopper operation. It has been found that a circuit that oscillates when the chopper is bypassed by shorting the output pole contact is found to work excellently with the chopper properly connected.

Should there for any reason be a condition where this circuit embodiment is not stable under closed loop conditions, the constant poles of the chopper can be adjusted, if desired, so that the time the output pole 15 is closed and oscillation may be possible is made extremely small compared with the excitation frequency, which is 400 c.p.s. for the circuit shown.

Because of the method used to sample the output to obtain the D.C. voltage, larger currents can be passed into the load circuit than has been possible in previous circuit configurations using choppers.

Through the circuit of this invention above described, D.C. signals may be amplified with negligible drift through the use of an A.C. amplifier. Also, a great improvement in stability against oscillation is achieved when it is desired to use the circuit with feedback, as in this embodiment.

As another application for this circuit, rather than straight D.C. signal amplification, the circuit may be used as a highly sensitive, drift-free, phase-sensitive detector. If so used in a manner that the input signal is of the same frequency as the chopper excitation frequency (or an integral multiple thereof) rather than one-tenth of the chopper excitation frequency, as in the case of the amplification use, this phase detection is possible. Under this situation, where a signal of the same frequency as the chopper excitation frequency is applied to the input, the output will be D.C. and proportional to the phase difference between the input signal and the excitation frequency plus the constant phase shift caused by the mechanical chopper lag, which can be compensated. In this manner, frequencies of 400 c.p.s. up to plus or minus approximately 40 c.p.s., 800 c.p.s. plus or minus 40 c.p.s., 1,200 c.p.s. plus or minus 40 c.p.s., etc., may be beat with the chopper excitation frequency, and then demodulated in the circuit. By this means, the difference frequency between the excitation frequency and the input frequency may be obtained to maximum excursions of about plus or minus 40 c.p.s.

Various changes and modifications in this circuit and its applications may be made, as will be apparent to those skilled in the art. Such modifications are within the teachings of this invention and the scope thereof, as defined by the claim appended hereto.

What is claimed is:

An amplifying system for amplifying D.C. signals and A.C. signals of a low frequency comprising a signal input lead connected to a first terminal, means for inverting the signal through a first pole of a double pole single throw mechanical chopper operating at a frequency of at least about ten times the frequency of said signal including a lead connecting the first pole with said first terminal, said first pole being connected to ground when the pole contact is made, means for amplifying the same by an amplifier including an amplifier input lead connected to said first terminal, means for demodulating the amplified signal through a second pole of said mechanical chopper operating 180° out of phase with the first pole including an amplifier output lead connected to said second pole, and said second pole being connected when the pole contact is made to a second terminal having connections in parallel to a grounded capacitor and resistance means, and a separate resistance feedback circuit connecting the first and second terminals in parallel with the amplifier and the mechanical chopper and having a much larger resistance than said resistance means to prevent discharge of said capacitor when the first pole contact of the chopper is made.

References Cited in the file of this patent

UNITED STATES PATENTS

| | | |
|---|---|---|
| 2,619,552 | Kerns | Nov. 25, 1952 |
| 2,684,999 | Goldberg et al. | July 27, 1954 |
| 2,709,205 | Colls | May 24, 1955 |
| 2,741,668 | Iffland | Apr. 10, 1956 |
| 2,744,969 | Peterson | May 8, 1956 |

FOREIGN PATENTS

| | | |
|---|---|---|
| 675,268 | Great Britain | July 9, 1952 |